United States Patent
Lee et al.

(10) Patent No.: US 7,521,289 B2
(45) Date of Patent: Apr. 21, 2009

(54) PACKAGE HAVING DUMMY PACKAGE SUBSTRATE AND METHOD OF FABRICATING THE SAME

(75) Inventors: Young-min Lee, Asan-si (KR); Kun-dae Yeom, Cheonan-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 142 days.

(21) Appl. No.: 11/213,702

(22) Filed: Aug. 30, 2005

(65) Prior Publication Data

US 2006/0050486 A1   Mar. 9, 2006

(30) Foreign Application Priority Data

Sep. 6, 2004   (KR) .................. 10-2004-0070782

(51) Int. Cl.
H01L 21/44   (2006.01)
(52) U.S. Cl. ............. 438/110; 438/107; 438/109; 438/455; 257/E23.001; 257/E23.031
(58) Field of Classification Search .......... 257/E23.001, 257/E23.003, E23.031, E23.063, E23.141, 257/E21.499, E21.505, E21.511; 438/106, 438/107, 108, 109, 110, 455
See application file for complete search history.

(56) References Cited

U.S. PATENT DOCUMENTS

| | | | | |
|---|---|---|---|---|
| 5,198,888 | A * | 3/1993 | Sugano et al. ............... | 257/686 |
| 5,579,207 | A * | 11/1996 | Hayden et al. ............... | 361/790 |
| 5,763,939 | A * | 6/1998 | Yamashita ................... | 257/668 |
| 6,414,391 | B1 * | 7/2002 | Corisis et al. ................ | 257/738 |
| 6,493,229 | B2 * | 12/2002 | Akram et al. ................ | 361/704 |
| 6,522,022 | B2 * | 2/2003 | Murayama ................... | 257/786 |
| 6,686,222 | B2 * | 2/2004 | Omizo et al. ............... | 438/107 |
| 6,774,478 | B2 * | 8/2004 | Eto et al. .................... | 257/686 |
| 6,998,703 | B2 * | 2/2006 | Di Stefano .................. | 257/686 |
| 7,145,226 | B2 * | 12/2006 | Kumamoto ................. | 257/686 |

(Continued)

FOREIGN PATENT DOCUMENTS

KR   10-0206969   4/1999

(Continued)

OTHER PUBLICATIONS

Notice to Submit Response for corresponding Korean Application No. 10-2004-0070782 and English translation thereof.

*Primary Examiner*—Alexander G Ghyka
(74) *Attorney, Agent, or Firm*—Harness, Dickey & Pierce, PLC

(57) ABSTRACT

A package may include a stack of unit chip packages, and each unit chip package may include a printed circuit board. The printed circuit board may support a semiconductor chip and a connection terminal for connecting to an adjacent unit chip package within the stack. A dummy package substrate may be disposed on the semiconductor chip of the uppermost unit chip package for protecting the semiconductor chip of the uppermost unit chip package. A method of fabricating a package may involve stacking unit chip packages so that the printed circuit board of a lower unit chip package abuts against a solder bump of an upper unit chip package, and stacking a dummy package substrate on the printed circuit board of an uppermost unit chip package.

14 Claims, 9 Drawing Sheets

U.S. PATENT DOCUMENTS

| | | |
|---|---|---|
| 2003/0107119 A1 | 6/2003 | Kim |
| 2003/0127736 A1* | 7/2003 | Eto et al. .................... 257/737 |
| 2003/0137041 A1* | 7/2003 | Blackshear et al. ......... 257/686 |
| 2004/0050571 A1 | 3/2004 | Lee et al. |
| 2004/0188855 A1* | 9/2004 | Nishimura et al. .......... 257/777 |
| 2005/0140021 A1* | 6/2005 | Wakisaka et al. ........... 257/777 |
| 2005/0199993 A1* | 9/2005 | Lee et al. .................... 257/686 |
| 2005/0269680 A1* | 12/2005 | Hsuan ........................ 257/686 |

FOREIGN PATENT DOCUMENTS

| | | |
|---|---|---|
| KR | 1020030040922 | 5/2003 |

* cited by examiner

PACKAGE HAVING DUMMY PACKAGE SUBSTRATE AND METHOD OF FABRICATING THE SAME

PRIORITY STATEMENT

This application claims priority of U.S. Nonprovisional Patent Application No. 11/100,526, filed Apr. 7, 2005, which claims priority of Korean Patent Application No. 10-2004-0070782, filed on Sep. 6, 2004, in the Korean Intellectual Property Office, the disclosure of both of which is incorporated herein in their entirety by reference.

BACKGROUND OF THE INVENTION

1. Field of the Invention

Example embodiments of the present invention relates in general to a semiconductor chip package and a method of fabricating the same, and more particularly to a multi-stack package (MSP) that may include a stack of semiconductor chips, and a method of fabricating the same.

2. Description of the Related Art

One way to increase capacitance of a semiconductor product may be to increase a packing density in a unit semiconductor device. This may involve a design rule decrease, that may result in expensive and time-consuming microscopic pattern techniques.

Another way to increase capacitance of a semiconductor product may be to implement MSP techniques. MSP techniques may involve stacking a plurality of unit semiconductor devices to form a single package. Conventional integration of a semiconductor device may be regarded as an increase of the packing density within a two-dimensional area, while MSP integration may be regarded as an increase of the packing density within a three-dimensional space by virtue of the semiconductor devices being stacked.

An MSP may be embodied in several ways. For example, unit chip packages may be stacked and electrically interconnected via a multi-step wire bonding process. As another example, which may be known as a ball grid array (BGA) type MSP, conductive solder bumps may be used to electrically interconnect and stack unit chip packages. BGA type MSPs may be fabricated without performing the multi-step wire bonding process.

A wire bonding BGA type MSP (wBGA), which may expose semiconductor chips, may be a recent focus in the BGA type multi-stack package technologies. However, the wBGA type MSP may not sufficiently protect the exposed semiconductor chips.

FIGS. 1A and 1B are sectional views of a conventional wBGA type MSP.

Referring to FIG. 1A, the conventional MSP 100 may have a structure in which a plurality of unit chip packages 140*a*, 140*b*, 140*c* and 140*d* are stacked.

Referring to FIG. 1B, the uppermost Unit chip package 140*d* may have a semiconductor chip 130*d* bonded on a printed circuit board (PCB) 110*d* by an adhesive 135*d*. The semiconductor chip 130*d* may be connected to the PCB 110*d* via a conductive wire 115*d*, and a solder bump 125*d* may be disposed on a surface of the PCB 110*d* as a connection terminal. The PCB 110*d* may include a board core 106*d* and photo solder resist layers 104*d* and 108*d* may be provided on opposite surfaces of the board core 106*d*. The wire 115*d* may be coated with an encapsulation layer 120*d*.

The unit chip packages 140*a*, 140*b*, 140*c* and 140*d* of FIG. 1A may have a structure similar to the unit chip package 140*d* shown in FIG. 1B. A metal plate 150 may be bonded to the semiconductor chip 130*d* of the uppermost unit chip package 140*d* of FIG. 1A by an adhesive 155. The metal plate 150 may protect the semiconductor chip 130*d* from the external environment.

Although the conventional metal plate 150 may be thought of as generally providing acceptable performance, it is not without shortcomings. For example, separate equipment may be necessary for mounting the metal plate 150 on the MSP 100. Also, the metal plate 150 may be fabricated from a material different from the lower unit chip packages 140*a*, 140*b*, 140*c* and 140*d*.

Furthermore, the uppermost unit chip package 140*d* may be bent due to bending of the metal plate 150 that may occur when the MSP 100 is module-mounted. In some cases, such bending may cause portions of the MSP 100 to become inadvertently separated. Moreover, the metal plate 150 may make the MSP 100 more cumbersome and heavy so that the MSP 100 may be more easily dropped during secondary module mounting.

SUMMARY OF THE INVENTION

According to an example, non-limiting embodiment of the present invention, a package may include a plurality of unit chip packages. Each unit chip package may have a printed circuit board with one side supporting a semiconductor chip and another side supporting a connection terminal. The plurality of unit chip packages may be stacked so that the printed circuit board of a lower unit chip package is connected to the connection terminal of an upper unit chip package. A dummy package substrate may be disposed on the printed circuit board of an uppermost unit chip package of the plurality of unit chip packages.

According to another example, non-limiting embodiment of the present invention, a method of fabricating a package may involve providing a plurality of unit chip packages. Each unit chip package may have a printed circuit board with one side supporting a semiconductor chip and another side supporting a solder bump. The unit chip packages may be stacked so that the printed circuit board of a lower unit chip package abuts against the solder bump of an upper unit chip package. A dummy package substrate may be stacked on the printed circuit board of an uppermost unit chip package.

BRIEF DESCRIPTION OF THE DRAWINGS

The present invention will become more apparent by describing in detail example, non-limiting embodiments thereof with reference to the attached drawings in which.

DETAILED DESCRIPTION OF EXAMPLE EMBODIMENTS OF THE INVENTION

Example, non-limiting embodiments of the present invention will now be described more fully with reference to the accompanying drawings. The invention may, however, be embodied in many different forms and should not be construed as being limited to the example embodiments set forth herein; rather these embodiments are provided so that this disclosure will be thorough and complete, and will fully convey the concept of the invention to those skilled in the art.

The Figures are intended to illustrate the general characteristics of example, non-limiting embodiments of the invention. The drawings are not, however, to scale and may not precisely reflect the characteristics of any given embodiment, and should not be interpreted as defining or limiting the range of values or properties of exemplary example embodiments within the scope of this invention. The relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

Figure 2A:
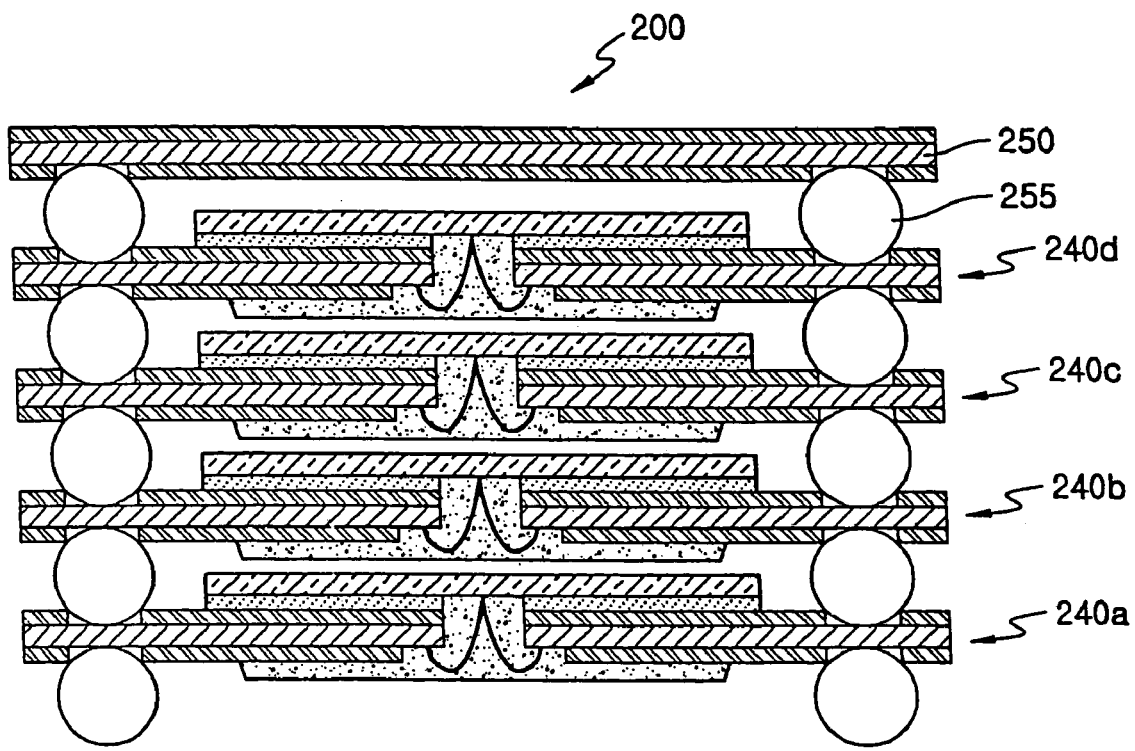
FIGS. 2A and 2B are sectional views of a multi-stack package according to an example embodiment of the present invention.
Figure 2B:
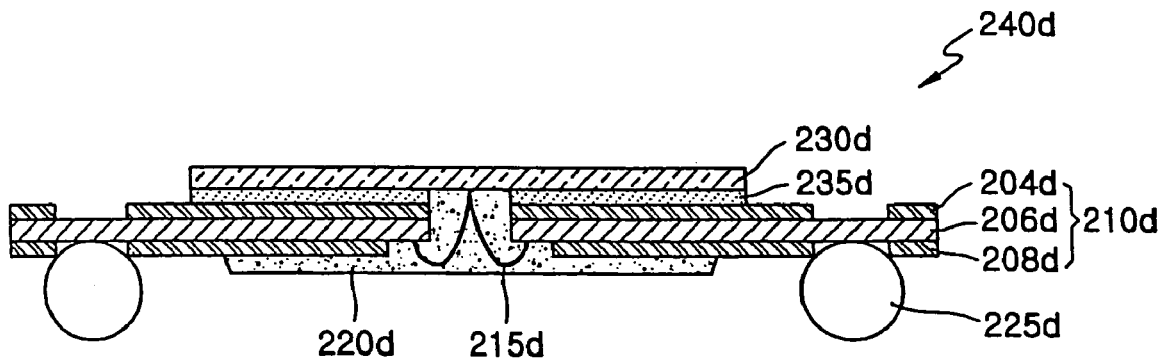

FIGS. 2A and 2B are sectional views of a multi-stack package (MSP) 200 according to an example embodiment of the present invention.

Referring to FIG. 2A, the MSP 200 may include four vertically stacked unit chip packages 240a, 240b, 240c and 240d, and a dummy package substrate. The dummy package substrate may be in the form of a dummy printed circuit board (PCB) 250 on the uppermost unit chip package 240d. Although the MSP 200 includes four unit chip packages, the present invention is not limited in this regard as more or less unit chip packages may be suitably implemented.

Referring to FIG. 2B, the uppermost unit chip package 240d may have a semiconductor chip 230d provided on a printed circuit board (PCB) 210d. For example, the semiconductor chip 230d may be mounted on the PCB 210d by an adhesive 235d. The semiconductor chip 230d may be electrically connected to the PCB 210d via a wire 215d. The wire 215d may penetrate through a hole of the PCB 210d.

A solder bump 225d may be attached to a surface of the PCB 210d as a connection terminal. Photo solder resist layers 204d and 208d may be placed on opposite major surfaces of a board core 206d of the PCB 210d. The wire 215d may be embedded in an encapsulation layer 220d. The encapsulation layer 220d may be an adhesive hardening layer, or some other suitable material that is well known in this art. The other unit chip packages 240a, 240b and 240c illustrated in FIG. 2A may be similarly constructed to the upper unit chip package 240d.

Figure 1A:
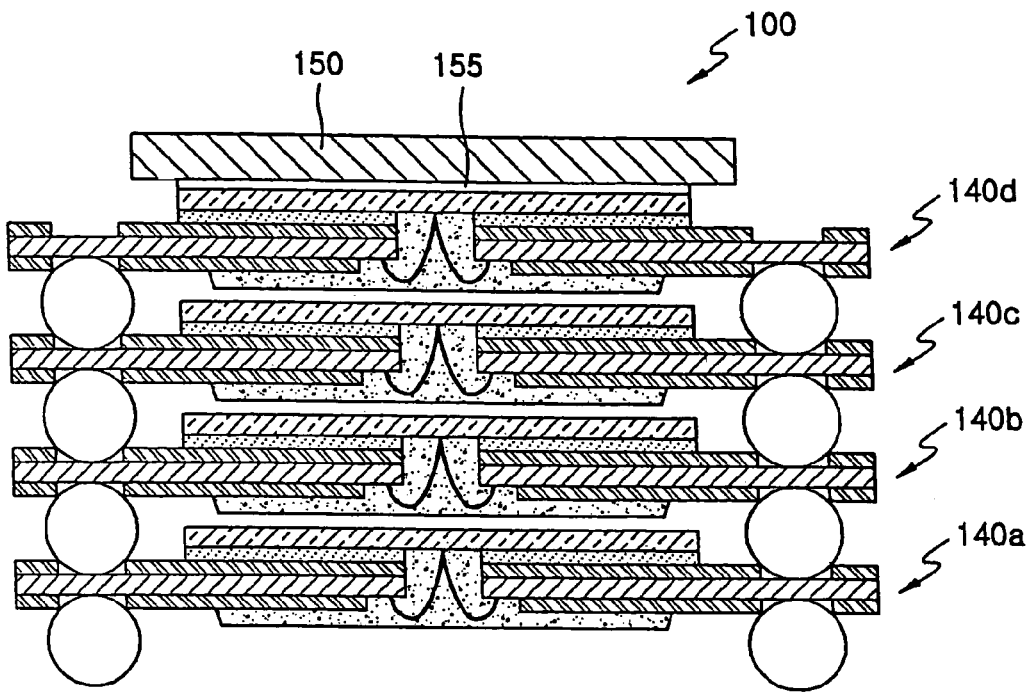
FIGS. 1A and 1B are sectional views of a conventional multi-stack package.
Figure 1B:
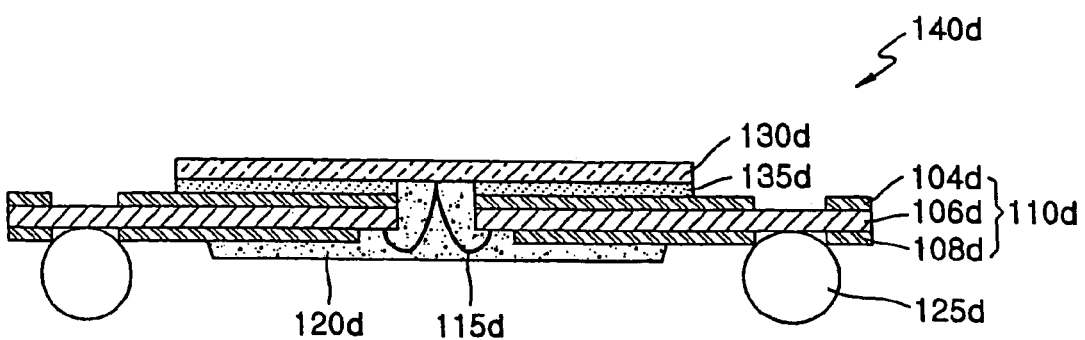

The dummy PCB 250 may be lighter than the conventional metal plate shown in FIG. 1A. By virtue of the lighter dummy PCB 250, the chance of dropping the MSP 200 during secondary plate module mounting may be reduced.

The dummy PCB 250 may protect the semiconductor chip 230d of the uppermost unit chip package 240d. The dummy PCB 250 may be mounted on the PCB 210d of the uppermost unit chip package 240d. To this end, the dummy PCB 250 may be provided with solder bumps 255. By way of example only, and not as a limitation of the invention, the solder bumps 255 may be ball shaped. Solder bumps 255 having alternative shapes may also be suitably implemented.

The dummy PCB 250 may protect the semiconductor chip 230d and the PCB 210d from the external environment. The dummy PCB 250 may reduce the chances of the semiconductor chip 230d being scratched, which may in some cases cause a circuit failure. Furthermore, as compared to the conventional metal plate depicted in FIG. 1A, the dummy PCB 250 may be less susceptible to being bent, and therefore may reduce some of the separation problems associated with conventional structures.

Figure 2C:
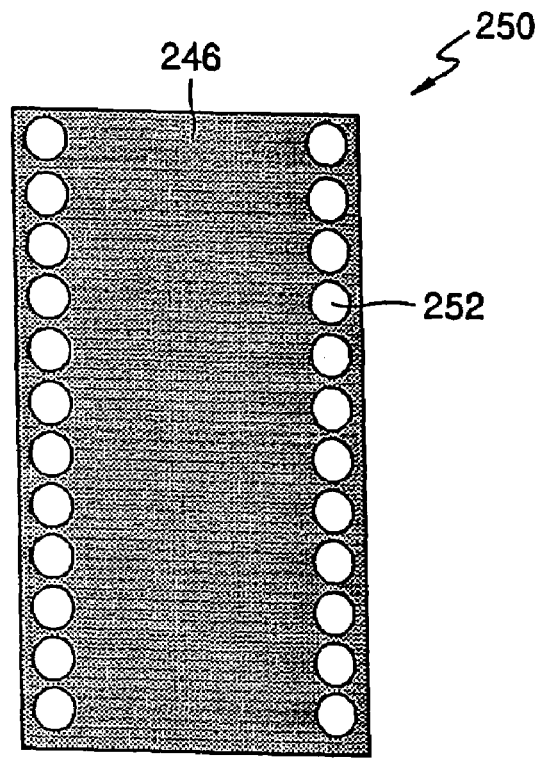
FIGS. 2C and 2D are bottom views of a dummy printed circuit substrate of the multi-stack package according to an example embodiment of the present invention.
Figure 2D:
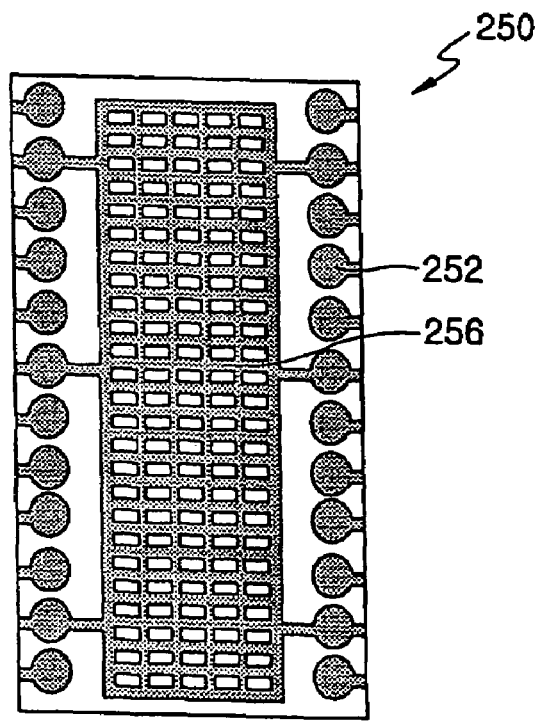

FIGS. 2C and 2D are bottom views of the dummy PCB 250 according to an example embodiment of the present invention.

Referring to FIG. 2C, a photo solder resist layer 246 may be provided over a surface of the dummy PCB 250. The photo solder resist layer 246 may expose a plurality of land patterns 252 to which the solder bumps 255 may be attached. The land patterns 252 may be provided along both sides of the surface of the dummy PCB 250, but the invention is not limited in this regard.

FIG. 2D shows the dummy PCB 250 with the photo solder resist layer 246 removed. As shown, a copper pattern 256 may be provided in addition to the land patterns 252 on the dummy PCB 250. As shown in FIG. 2C, the photo solder resist layer 246 may cover the copper pattern 256 (and is therefore hidden from view in FIG. 2C) and expose the ball land patterns 252.

The copper pattern 256 may be meshed, for example, as shown in FIG. 2D. The copper pattern 256 may facilitate heat discharge. The copper pattern 256 is not limited to any particular configuration and may be provided as a full copper pattern, for example. Furthermore, each of the ball land patterns 252 may be formed as an individual and distinct pad, but the invention is not limited in this regard. For example, a ball land pattern 252 may be contiguous with the copper pattern 256, which may provide a common ground (or ground plane) that may decrease noise.

Figure 2E:
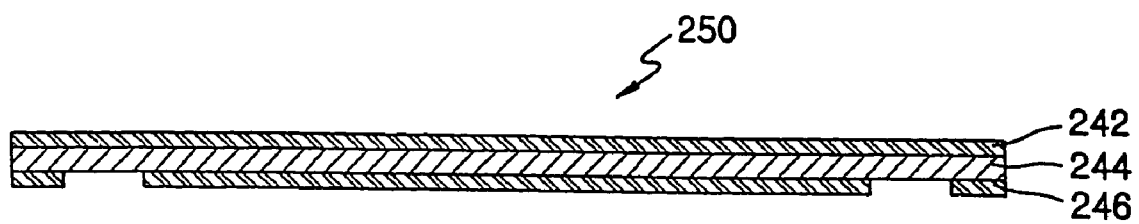
FIGS. 2E through 2G are sectional views of the dummy printed circuit substrate of the multi-stack package according to an example embodiment of the present invention.
Figure 2F:
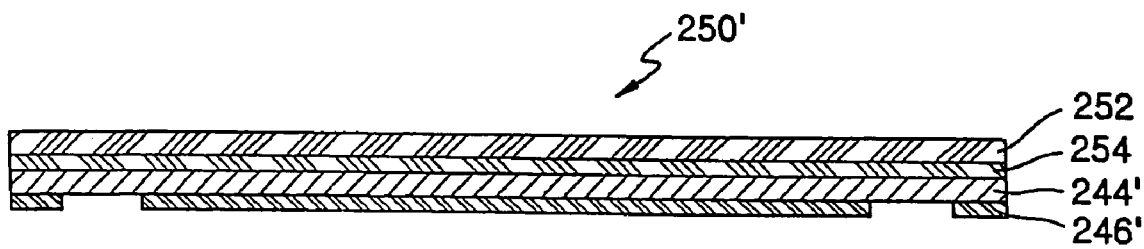
Figure 2G:
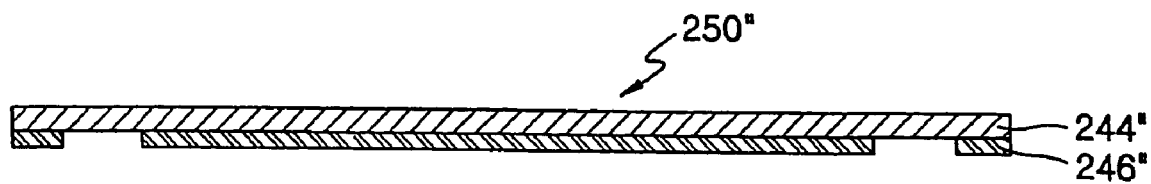

FIGS. 2E through 2G are sectional views of example dummy PCBs that may be suitably implemented.

Referring to FIGS. 2E to 2G, a surface (e.g., the upward facing surface in the Figures) of the dummy PCB may be embodied in various forms considering laser marking, for example. Referring to FIG. 2E, the dummy PCB 250 may include a copper interconnect pattern (not shown) provided on a surface (e.g., the upper surface in the Figure) of a board core 244, and the photo solder resist layer 242 may be formed on the board core 244. The photo solder resist layer 242 may cover the copper interconnect pattern.

Referring to FIG. 2F, the dummy PCB 250' may include a photo solder resist layer 246' on one surface of a board core 244', and a copper foil 254 may be provided on another surface of the board core 244'. A nickel plating layer 252 may be provided on the copper foil 254.

Referring to FIG. 2G, the dummy PCB 250" may include a photo solder resist layer 246" on only one surface of the board core 244".

The dummy PCB 250 may be used as a protecting layer, thereby improving reliability of the MSP 200.

Figure 2H:
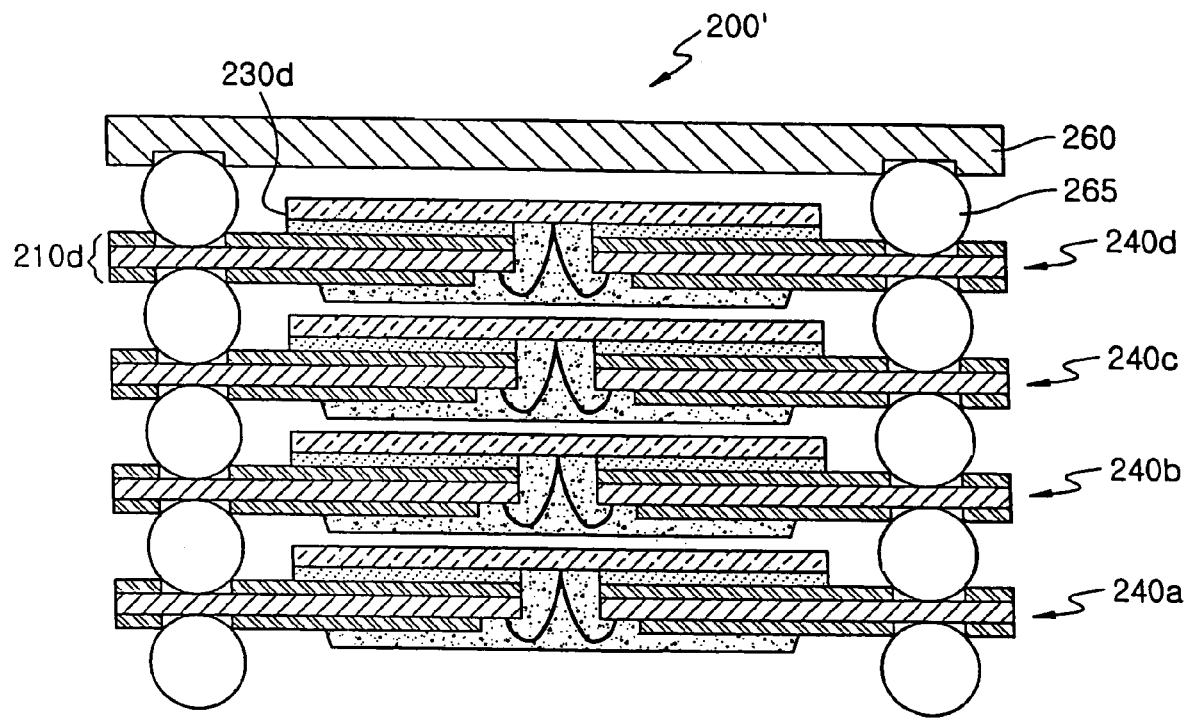
FIG. 2H is a sectional view of a multi-stack package according to another example embodiment of the present invention.

FIG. 2H is a sectional view of an MSP 200' according to another example embodiment of the present invention. The MSP 200' may be similar to the one described in the previous embodiment, except for the dummy package substrate.

Referring to FIG. 2H, the MSP 200' may include a tape 260 as a dummy package substrate on the uppermost unit chip package 240d. By way of example only, and not as a limitation of the invention, the tape 260 may be fabricated from polyimide. The MSP 200' using the tape 260 as a protecting layer may be lighter than the conventional MSP using the metal plate as a protecting layer, and therefore damage that may result from dropping the MSP 200' (e.g., during a secondary module mounting process) may be reduced.

The tape 260 may be mounted on the PCB of the uppermost unit chip package 240d. To this end, the tape 260 may be provided with solder bumps 265 that may connect to the uppermost unit chip package 240d. The tape 260 may protect the semiconductor chip 230d and the PCB 210d from the external environment during, for example, module mounting of the MSP 200'.

The tape 260 may protect the semiconductor chip 230d from being scratched, and may decrease an external load that may be imposed upon the uppermost unit chip package 240d. Also, as compared to the conventional metal plate depicted in FIG. 1A, the tape 260 may be less susceptible to being bent, and therefore may reduce some of the separation problems associated with conventional structures.

Figure 3A:
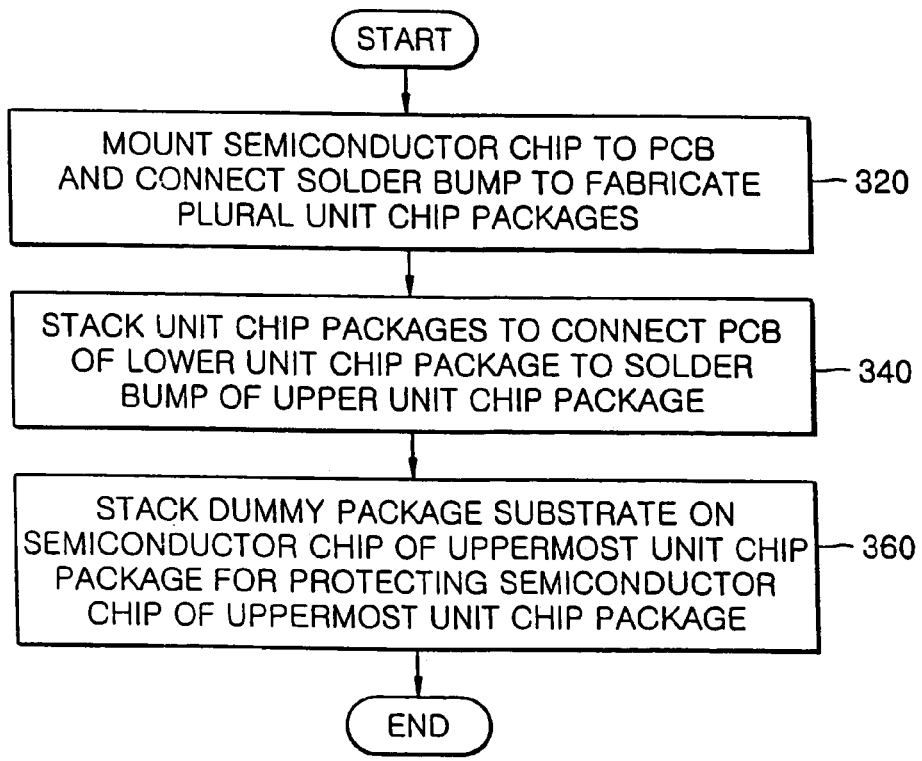
FIGS. 3A and 3B are flowcharts of a method of fabricating the multi-stack package according to an example embodiment of the present invention.
Figure 3B:
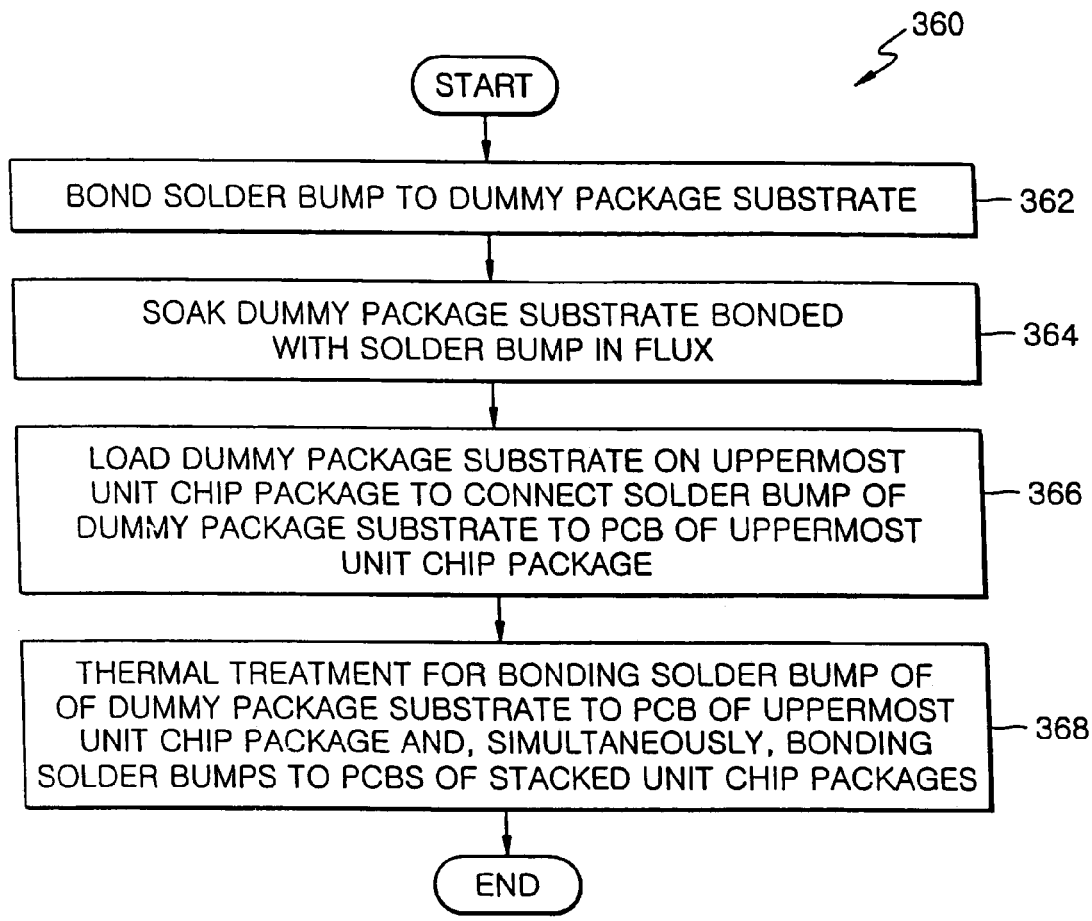

FIGS. 3A and 3B are flowcharts of an example method that may be implemented to fabricate the MSP according embodiments of the present invention. FIGS. 3C through 3G are sectional views of various stages of an example method that be implemented to fabricate the MSP according to embodiments of the present invention.

The example fabricating method will be described with reference to FIGS. 3C through 3H in the order of the flowcharts shown in FIGS. 3A and 3B.

Figure 3C:
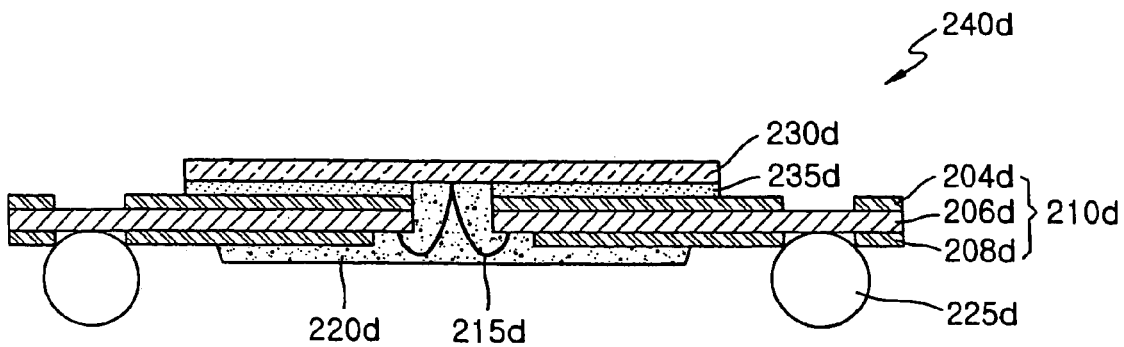
FIGS. 3C through 3H are sectional views showing the method of fabricating the multi-stack package according to an example embodiment of the present invention.

Referring to FIG. 3C, the semiconductor chip 230d may be mounted on the PCB 210d, and the solder bumps 225d may be connected to the PCP 210d, thereby fabricating the unit chip package 240d. By repeating these operations, a plurality of unit chip packages 240a, 240b, 240c and 240d of FIG. 3D may be fabricated (step 320 of FIG. 3A).

The structure of the unit chip packages 240a, 240b, 240c and 240d may be like the structure discussed with reference to FIGS. 2A and 2B. Further, well known fabricating techniques may be suitably implemented to prepare the individual unit chip packages.

Figure 3D:
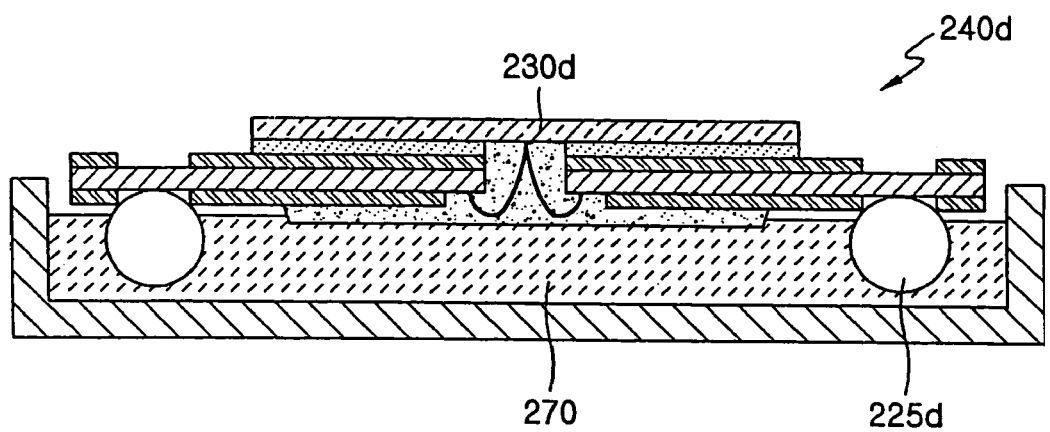
Figure 3E:
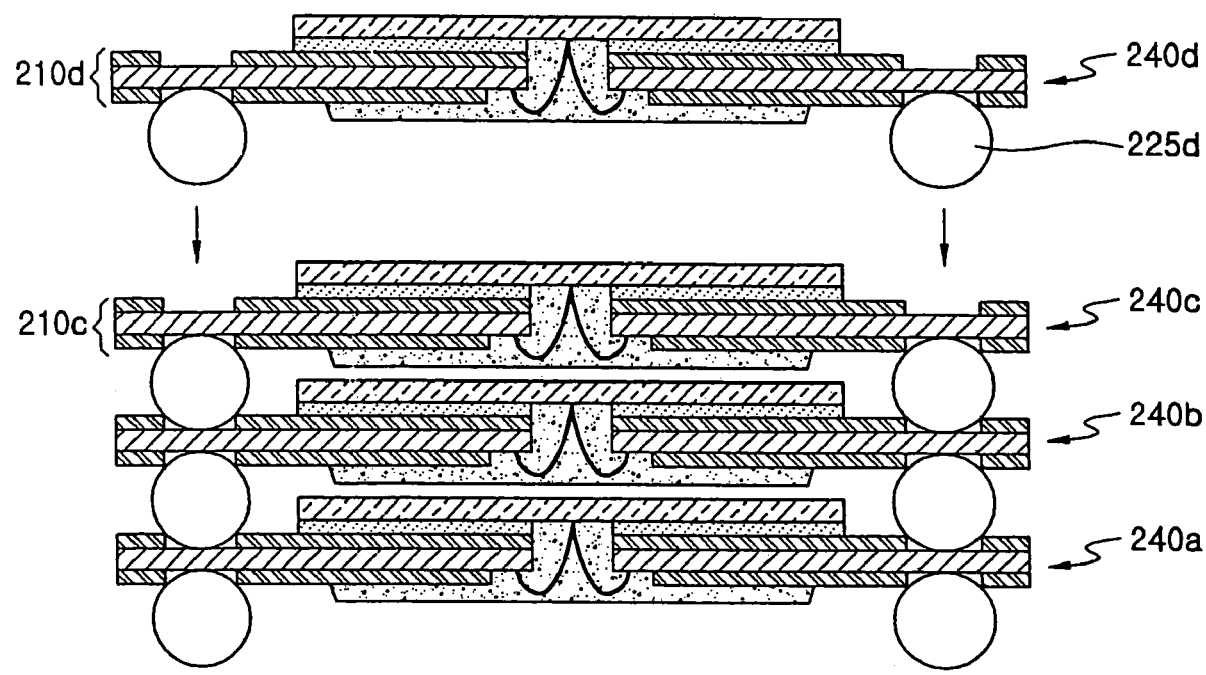

Referring to FIGS. 3D and 3E, the unit chip packages may be stacked so that the PCB of a lower unit chip package may be connected to the solder bump of an upper chip package (step 340 of FIG. 3A). FIGS. 3D and 3E illustratively show stacking of the fourth unit chip package 240d on the third unit chip package 240c.

The stacking (step 340) may include soaking the solder bump 225d of the upper unit chip package 240d in a flux 270 for enhancing a bonding property. The upper unit chip package 240d may be mounted on the lower unit chip package 240c so that the solder ball 225d of the upper unit chip package 240d may be connected to the PCB 210c of the lower unit chip package 240c. The stacked lower unit chip packages 240a, 240b and 240c may be obtained by repeating the stacking of the uppermost unit chip package 240d.

Figure 3F:
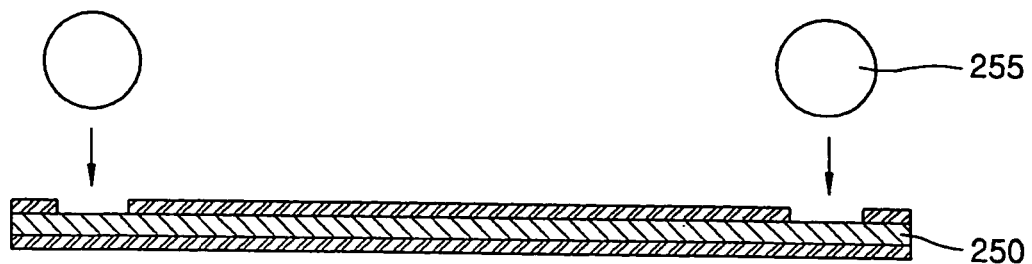
Figure 3G:
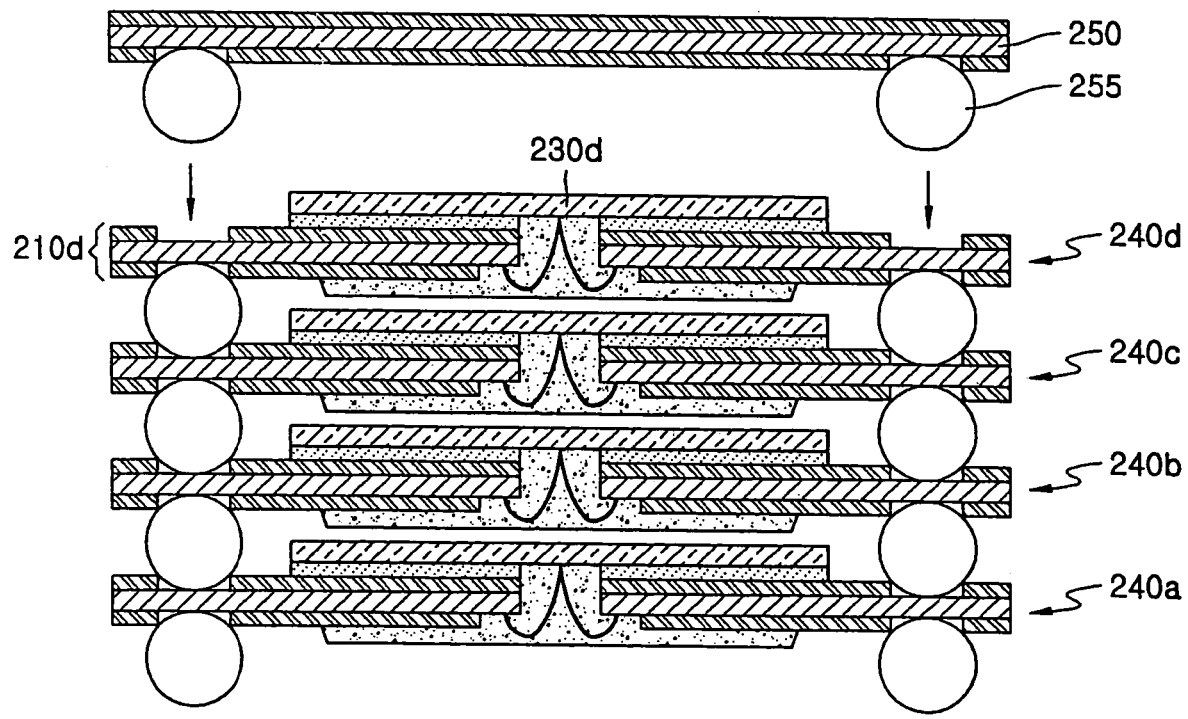

Referring to FIG. 3G, the dummy package substrate, e.g., the dummy PCB 250, may be stacked on the PCB 210d of the uppermost unit chip package 240d for protecting the semiconductor chip 230d of the uppermost unit chip package 240d (step 360 in FIG. 3A). Of course the tape may be used as the dummy package substrate. Example embodiments of the present invention may reduce manufacturing costs by using a general package substrate as the dummy package substrate 250 for protecting the semiconductor chip (230d).

Figure 3H:
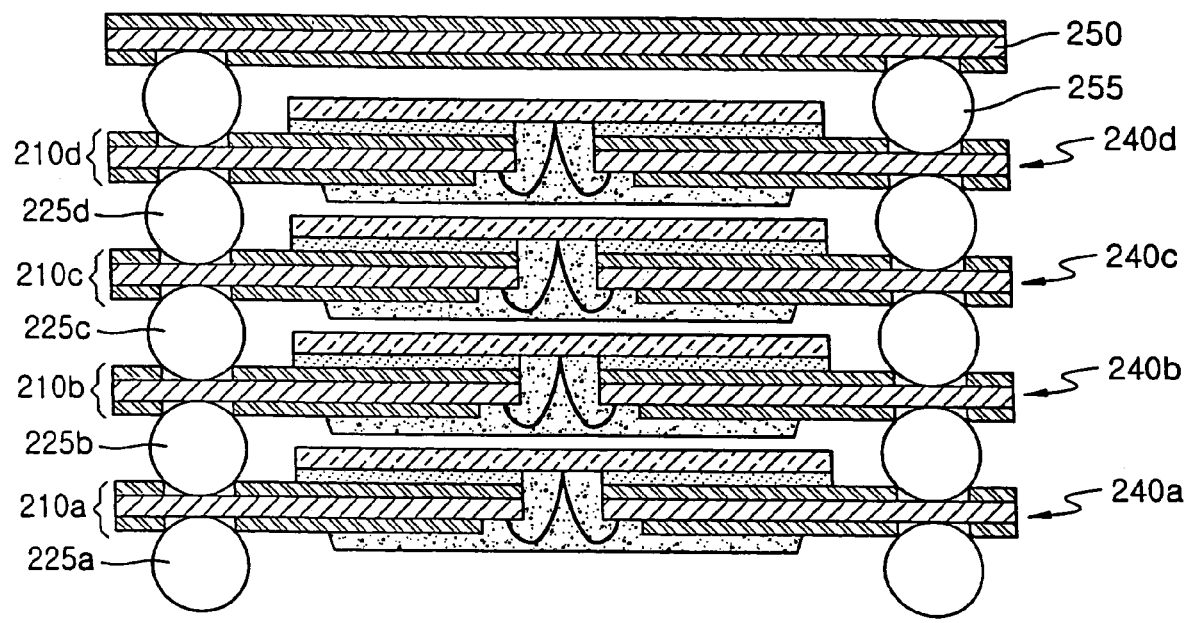

The stacking of the dummy package substrate (step 360) may be described in more detail with reference to FIGS. 3B and 3F through 3H. In FIGS. 3F through 3H, the dummy PCB 250 may be the dummy package substrate. It will be appreciated, however, that the following techniques may be applied to the tape. The stacking of the dummy package substrate (step 360) will be described with reference to sectional views shown in FIGS. 3F through 3H and in the order of the flowchart of FIG. 3B.

The solder bump 255 may be bonded to the dummy PCB 250 as shown in FIG. 3F (step 362 in FIG. 3B). The dummy PCB 250 may be soaked in flux (step 364 in FIG. 3B). At this time, the solder bump 255 may be soaked to a sufficient depth to get wet by the flux.

Referring to FIG. 3G, the dummy PCB 250 may be mounted on the uppermost unit chip package 240d so as to connect the solder bump 255 bonded onto the dummy PCB 250 to the PCB 210d of the uppermost unit chip package 240d (step 366 in FIG. 3B).

Referring to FIG. 3H, a thermal treatment may be performed for bonding the solder bump 255 adhering on the dummy PCB 250 to the PCB 210d of the uppermost unit chip package 240d. Simultaneously, the solder balls 225a, 225b, 225c and 225d of the stacked unit chip packages 240a, 240b, 240c and 240d may be bonded to the PCBs 210a, 210b, 210c and 210d (step 368 in FIG. 3B).

The thermal treatment may be performed at a temperature range from 200 to 250° C. so as to reflow the solder bumps 255, 225a, 225b, 225c and 225d. The solder bumps 255, 225a, 225b, 225c and 225d are firmly bonded to the dummy package substrate 250 and the PCBs 210a, 210b, 210c and 210d during reflowing.

The thermal treatment with respect to the solder balls 225a, 225b, 225c and 225d of the unit chip packages 240a, 240b, 240c and 240d and the solder ball 255 of the dummy PCB 250 may be carried out only once, thereby decreasing the processing time. In other words, reflowing the solder balls that conductively bonds the unit chip packages 240a, 240b, 240c and 240d may be omitted when stacking them.

Furthermore, the use of a conventional metal plate may necessitate additional material and metal plate attachment equipment. However, stacking the dummy PCB 250 may be implemented using a typical package substrate and using the same equipment that may stack the unit chip packages 240a, 240b, 240c and 240d, which is economical.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claim is:

1. A method comprising:
   providing a plurality of unit chip packages, each unit chip package having a printed circuit board with one side supporting a semiconductor chip and another side supporting a solder bump;
   stacking the unit chip packages so that the printed circuit board of a lower unit chip package abuts against the solder bump of an upper unit chip package; and
   stacking a dummy package substrate on the printed circuit board of an uppermost unit chip package, wherein the dummy package substrate is a dummy printed circuit board.

2. The method of claim 1, wherein the stacking of the dummy package substrate comprises bonding the dummy package substrate to the uppermost unit chip package using a solder bump.

3. A method comprising:
   providing a plurality of unit chip packages, each unit chip package having a printed circuit board with one side supporting a semiconductor chip and another side supporting a solder bump;

stacking the unit chip packages so that the printed circuit board of a lower unit chip package abuts against the solder bump of an upper unit chip package;

stacking a dummy package substrate on the printed circuit board of an uppermost unit chip package, wherein
the stacking of the dummy package substrate comprises bonding the dummy package substrate to the uppermost unit chip package using a solder bump, wherein the stacking of the dummy package substrate comprises:

bonding the solder bump to the dummy package substrate;

soaking the dummy package substrate bonded with the solder bump in a flux;

positioning the dummy package substrate on the uppermost unit chip package so that the solder bump of the dummy package substrate abuts against the printed circuit board of the uppermost unit chip package; and performing a thermal treatment for bonding the solder bump of the dummy package substrate to the printed circuit board of the uppermost unit chip package and, simultaneously, bonding the solder bumps of the stacked unit chip packages to the printed circuit boards.

4. The method of claim 3, wherein thermal treatment is performed at a temperature ranging from 200 to 250° C. so as to reflow the solder bumps of the dummy package substrate and of the printed circuit boards.

5. The method of claim 1, wherein the stacking of the unit chip packages comprises:

soaking the solder bump of the upper unit chip package in a flux; and mounting the upper unit chip package onto the lower unit chip package to connect the solder bump of the upper unit chip package to the printed circuit board of the lower unit chip package.

6. The method of claim 1, wherein a photo solder resist layer is provided on the dummy printed circuit board, and
wherein the photo solder resist layer exposes a land pattern to which the solder bump is bonded.

7. The method of claim 6, wherein a copper pattern is provided on the dummy printed circuit board to facilitate heat discharge.

8. The method of claim 7, wherein the copper pattern is a meshed pattern.

9. The method of claim 1, wherein a copper interconnect pattern is provided on the dummy printed circuit board, and the copper interconnect pattern is covered with a photo soldier resist layer.

10. The method of claim 1, wherein a copper foil is provided on the dummy printed circuit board, and the copper foil is covered with a nickel-plating layer.

11. A method comprising:
providing a plurality of unit chip packages, each unit chip package having a printed circuit board with one side supporting a semiconductor chip and another side supporting a solder bump;

stacking the unit chip packages so that the printed circuit board of a lower unit chip package abuts against the solder bump of an upper unit chip package; and stacking a dummy package substrate on the printed circuit board of an uppermost unit chip package, wherein the dummy package substrate is a tape.

12. The method of claim 11, wherein the tape is fabricated from polyimide.

13. A package manufactured in accordance with the method of claim 1.

14. A package manufactured in accordance with the method of claim 11.

* * * * *